(12) United States Patent
Lowes et al.

(10) Patent No.: US 10,331,032 B2
(45) Date of Patent: Jun. 25, 2019

(54) PHOTOSENSITIVE, DEVELOPER-SOLUBLE BOTTOM ANTI-REFLECTIVE COATING MATERIAL

(71) Applicant: Brewer Science Inc., Rolla, MO (US)

(72) Inventors: Joyce Lowes, Rosebud, MO (US); Jinhua Dai, Rolla, MO (US); Alice Guerrero, Rolla, MO (US)

(73) Assignee: Brewer Science, Inc., Rolla, MO (US)

( * ) Notice: Subject to any disclaimer, the term of this patent is extended or adjusted under 35 U.S.C. 154(b) by 0 days.

(21) Appl. No.: 13/867,815

(22) Filed: Apr. 22, 2013

(65) Prior Publication Data

US 2013/0280656 A1    Oct. 24, 2013

Related U.S. Application Data

(60) Provisional application No. 61/636,919, filed on Apr. 23, 2012.

(51) Int. Cl.
| | | |
|---|---|---|
| G03F 7/09 | (2006.01) | |
| G03F 7/20 | (2006.01) | |
| G03F 7/32 | (2006.01) | |
| G03F 7/40 | (2006.01) | |
| G03F 7/095 | (2006.01) | |
| H01L 21/266 | (2006.01) | |

(52) U.S. Cl.
CPC ............ G03F 7/091 (2013.01); G03F 7/095 (2013.01); G03F 7/20 (2013.01); G03F 7/322 (2013.01); G03F 7/40 (2013.01); H01L 21/266 (2013.01)

(58) Field of Classification Search
CPC ....... H01L 21/266; G03F 7/095; G03F 7/091; G03F 7/322; G03F 7/20; G03F 7/40
See application file for complete search history.

(56) References Cited

U.S. PATENT DOCUMENTS

| | | |
|---|---|---|
| 3,776,729 A | 12/1973 | Levy et al. |
| 6,316,165 B1 | 11/2001 | Pavelchek et al. |
| 6,670,425 B2 | 12/2003 | Puligadda et al. |
| 6,962,769 B2 | 11/2005 | Shao et al. |
| 7,323,289 B2 | 1/2008 | Neef et al. |
| 7,601,483 B2 | 10/2009 | Guerrero et al. |
| 8,039,202 B2 | 10/2011 | Sui et al. |
| 8,383,318 B2 | 2/2013 | Meador et al. |
| 2002/0015909 A1 | 2/2002 | Mizutani et al. |
| 2003/0162125 A1 | 8/2003 | Deshpande |
| 2005/0042538 A1 | 2/2005 | Babich et al. |
| 2005/0214674 A1* | 9/2005 | Sui ........................ G03F 7/0392 430/270.1 |
| 2008/0038659 A1 | 2/2008 | Wu et al. |
| 2008/0044772 A1 | 2/2008 | Guerrero et al. |
| 2008/0138744 A1 | 6/2008 | Hatanaka et al. |
| 2009/0111057 A1 | 4/2009 | Xu et al. |
| 2009/0317747 A1 | 12/2009 | Guerrero et al. |
| 2010/0075253 A1 | 3/2010 | Kato et al. |
| 2010/0291483 A1* | 11/2010 | Hamada et al. ............ 430/282.1 |
| 2011/0104613 A1 | 5/2011 | Yao et al. |
| 2013/0186851 A1 | 7/2013 | Sullivan et al. |

FOREIGN PATENT DOCUMENTS

| | | |
|---|---|---|
| CN | 1942826 | 4/2007 |
| TW | 581726 B | 4/2004 |
| WO | 2008/072624 A1 | 6/2008 |
| WO | WO-2013/163100 A1 * | 10/2013 ............. G03F 7/091 |

OTHER PUBLICATIONS

IUPAC: "Catalyst" from PAC, 1996, 68, 149 (a glossary of terms used in chemical kinetics, including reaction dynamics (IUPAC Recommendations 1996)) on p. 155 obtained from IUPAC. Compendium of Chemical Terminology, 2nd ed. (the "Gold Book"). Compiled by A. D. McNaught and A. Wilkinson. Blackwell Scientific Publications, Oxford (1997).*
IUPAC: "pseudo-catalysis" from PAC, 1994, 66, 1077 (Glossary of terms used in physical organic chemistry (IUPAC Recommendations 1994)) on p. 1153.*
International Search Report and Written Opinion dated Jul. 26, 2013 in corresponding PCT/US2013/037626 filed on Apr. 22, 2013.
International Preliminary Report on Patentability dated Nov. 6, 2014 in corresponding PCT/US2013/037626 filed on Apr. 22, 2013.
Cameron et al., "Developable BARC (DBARC) Technology as a Solution to Today's Implant Lithography Challenges," Proc. of SPIE, vol. 7972, 2011, 797214-1-797214-10.
Houlihan et al., "Second Generation Radiation Sensitive 193 nm Developable Bottom Anti Reflective Coatings (DBARC): Recent Results.," Proc. of SPIE, vol. 6923, 2008, 692330-1-692330-7.
Houlihan et al., "Second Generation Radiation Sensitive Developable Bottom Anti Reflective Coatings (DBARC) and Implant Resists Approaches for 193nm Lithography.," Proc of SPIE, vol. 6519, 2007, 65190L-1-65190L-8.
Houlihan et al., "Radiation Sensitive Developable Bottom Anti-Reflective Coatings (DBARC): Recent Results," Proc. of SPIE, vol. 7273, 2009, 727316-1-727316-8.
Cameron et al., "Design and Development of Production Worthy Developable BARCs (DBARCs) for Implant Lithography," Proc. of SPIE, vol. 7639, 2010, 76390H-1-76390H-12.

* cited by examiner

*Primary Examiner* — Cynthia Hamilton
(74) *Attorney, Agent, or Firm* — Hovey Williams LLP (57) ABSTRACT

Photosensitive, developer-soluble bottom anti-reflective coatings are described. Compositions and methods of forming the same are also disclosed along with resulting microelectronic structures. The anti-reflective compositions comprise a multi-functional epoxy compound having multiple epoxy moieties pendant therefrom and one or more crosslinkable chromophores bonded thereto. The compounds are dispersed or dissolved in a solvent system with a vinyl ether crosslinker and can be used to create crosslinkable and de-crosslinkable coatings for microelectronics fabrication.

19 Claims, 2 Drawing Sheets

PHOTOSENSITIVE, DEVELOPER-SOLUBLE BOTTOM ANTI-REFLECTIVE COATING MATERIAL

CROSS-REFERENCE TO RELATED APPLICATIONS

The present application claims the priority benefit of U.S. Provisional Patent Application Ser. No. 61/636,919, filed Apr. 23, 2012, entitled SMALL MOLECULE, PHOTOSENSITIVE, DEVELOPER-SOLUBLE BOTTOM ANTI-REFLECTIVE COATING MATERIAL, incorporated by reference in its entirety herein.

BACKGROUND

Field of the Invention

The present disclosure relates to new anti-reflective coating formulations, methods of using the same, and microelectronic structures formed therefrom.

Description of Related Art

Bottom anti-reflective coatings are generally classified as either dry etch or developer-soluble. Dry-etch bottom anti-reflective coatings are well known, and are either thermoplastic materials that are applied in a certain solvent and are not soluble in the photoresist solvent, or are thermosets that are crosslinked and thus rendered insoluble in the photoresist solvent. Developer-soluble bottom anti-reflective coatings are classified as non-photosensitive (isotropic development) or photosensitive (anisotropic development). Non-photosensitive, developer-soluble bottom anti-reflective coatings may be thermoplastic materials that are applied in a certain solvent and are not soluble in the photoresist solvent but have acid groups that render the polymer soluble in base developer. Non-photosensitive, developer-soluble bottom anti-reflective coatings may also be partially crosslinked, thermoset materials that retain enough acid functionalities to still be soluble in base developer. Photosensitive bottom anti-reflective coatings have acid-labile crosslinks that are activated by photoacid generators. Other crosslinked photosensitive bottom anti-reflective coatings are known, but the nature of the crosslinking and the source of developer solubility is unclear. Other photosensitive bottom anti-reflective coatings behave more like photoresists in that dissolution in base is accomplished primarily by the cleavage of an acid-labile group that generates an acid unit in the polymer.

Previous photosensitive, developer-soluble, bottom anti-reflective coatings contain an acrylate terpolymer that contains a chromophore, a crosslinking unit, and an acid-labile group. These terpolymers offer good performance at larger critical dimensions (CDs), but resolution requirements have increased and this chemistry is not capable of achieving the necessary resolution of the smaller features. The molecular weight of the terpolymers has also become an issue since it is more difficult to dissolve and then completely remove the large molecules in alkaline developer.

Thus, there remains a need in the art for improved materials to formulate bottom anti-reflective coatings.

SUMMARY

The present disclosure is broadly concerned with photosensitive, developer-soluble anti-reflective compositions for microelectronics fabrication. The compositions comprise a multi-functional epoxy compound comprising one or more crosslinkable chromophores bonded thereto. The compounds are dispersed or dissolved in a solvent system with a vinyl ether crosslinker, and optionally a photoacid generator.

Methods of forming a microelectronic structures are also described herein. The methods comprise providing a substrate having a surface, and optionally one or more intermediate layers formed thereon; forming a photosensitive, developer-soluble anti-reflective layer on the substrate surface, or on the uppermost intermediate layer if present; and forming an imaging layer on the anti-reflective layer. The anti-reflective layer is formed from an anti-reflective composition comprising a multi-functional epoxy compound and a vinyl ether crosslinker dispersed or dissolved in a solvent system, wherein the multi-functional epoxy compound comprises one or more crosslinkable chromophores bonded thereto.

The invention is also concerned with microelectronic structures comprising a substrate having a surface and one or more optional intermediate layers formed thereon; a cured photosensitive, developer-soluble anti-reflective layer adjacent the substrate surface, or adjacent the uppermost intermediate layer, if present; and an imaging layer adjacent the anti-reflective layer. The anti-reflective layer is formed from an anti-reflective composition comprising a multi-functional epoxy compound and a vinyl ether crosslinker dispersed or dissolved in a solvent system, wherein the multi-functional epoxy compound comprises one or more crosslinkable chromophores bonded thereto.

DETAILED DESCRIPTION OF PREFERRED EMBODIMENTS

The present disclosure is concerned with compositions useful as anti-reflective coatings, methods of using the same, and microelectronic structures. The anti-reflective coatings are reliable photosensitive and developer-soluble materials that are useful for many emerging technologies in the semiconductor industry. For example, the anti-reflective coatings can be used for KrF and ArF lithography, and also can be incorporated into implant and imaging layers. They are particularly useful for implant applications where the substrate beneath the anti-reflective coating and photoresist is sensitive to dry (plasma) etch and therefore a wet (alkaline developer) etch would be used. These materials can also be used on any area that requires the use of a developer-soluble coating.

The compositions when cured are preferably insoluble in both organic solvents and photoresist developers, but can be decrosslinked in the presence of an acid and removed with aqueous alkaline developer. In some aspects, the cured (i.e., crosslinked) anti-reflective coating composition is decrosslinked upon exposure to light (193 nm-365 nm), followed by a post-exposure bake. That is, the composition is intrinsically photosensitive, and can be patterned by exposure to light of at least 2 mJ/cm². In other aspects, the composition relies on acid diffusing from another layer (such as a photoresist) during exposure to decrosslink the cured composition. In either case, this results in exposed and unexposed portions of the anti-reflective coating having different dissolution rates, allowing the exposed portions to be selectively removed without removing the unexposed portions. Thus, in both aspects, the inventive bottom anti-reflective coating compositions are wet developable. The terms "developer-soluble" or "wet developable" are used synonymously herein to mean the composition is capable of being rendered soluble in base developer upon decrosslinking so that it can be substantially removed with conventional alkaline developers, as described herein.

The compositions comprise a multi-functional epoxy compound dispersed or dissolved in a solvent system. The term "multi-functional epoxy compound" refers to compounds having at least two epoxy moieties pendant from a core unit. The terms "epoxy moiety" or "epoxy moieties" is used herein to refer to both closed epoxide rings and ring-opened (reacted) epoxy groups, as well as derivatives thereof, such as reacted or unreacted glycidyl groups, glycidyl ether groups, and the like. The compounds can be nonpolymeric compounds having multiple epoxy moieties radiating from a central core unit, or they can be polymeric compounds having multiple epoxy moieties pendant from the polymeric core unit (i.e., polymer backbone). The term "nonpolymeric" is used to signify that the compounds do not have a polymer (or oligomer) backbone comprised of repeating units typically created through polymerization. The term "polymer" is used synonymously herein with "oligomer" and is defined as referring to compounds having a backbone containing monomeric repeat units. Regardless, the multi-functional epoxy compounds have a weight average molecular weight of at least about 800 Daltons, preferably from about 800 to about 50,000 Daltons, and more preferably from about 800 Daltons to about 15,000 Daltons.

As mentioned above, the multi-functional epoxy compounds comprise a core unit, which can be the central core of the nonpolymeric compound or the backbone of a polymeric compound, and in either case comprises multiple epoxy moieties attached thereto. The core unit can comprise (consist essentially or even consist of) a single aromatic compound, linear or branched molecules, and/or monomeric repeat units of acrylics, polyesters, epoxy/cresol novolacs, polyethers, polysaccharides, and/or polyimide/polyamides with epoxy groups pendant therefrom. In one or more embodiments, the core unit comprises from about 1 to about 10,000 epoxy moieties, preferably from about 2 to about 2,000 epoxy moieties, and more preferably from about 3 to about 2,000 epoxy moieties. The core unit can also be selected to have light absorbance properties at the wavelength of interest (193 nm-365 nm) to further enhance the anti-reflective characteristics of the composition.

Suitable core unit precursors include materials containing multiple functional glycidyls, such as tris(2,3-epoxypropyl) isocyanurate, tris(4-hydroxylphenyl) methane triglycidyl ether, trimethylopropane triglycidyl ether, poly(ethylene glycol)diglycidyl ether, bis[4-(glycidyloxy)phenyl]methane, bisphenol A diglycidyl ether, 1,4-butanediol diglycidyl ether, resorcinol diglycidyl ether, 4-hydroxybenzoic acid diglycidyl ether, glycerol diglycidyl ether, 4,4'-methylenebis (N,N-diglycidyl aniline), monoallyl diglycidyl isocyanurate, tetrakis(oxiranylmethyl)benzene-1,2,4,5-tetracarboxylate, bis(2,3-epoxypropyl)terephthalate, and tris(oxiranylmethyl) benzene-1,2,4-tricarboxylate. Other suitable core unit precursors include 1,3-bis(2,4-bis(glycidyloxy)phenyl)adamantane, 1,3-bis(1-adamantyl)-4,6-bis(glycidyloxy)benzene, 1-(2',4'-bis(glycidyloxy)phenyl)adamantane, and 1,3-bis(4'-glycidyloxyphenyl)adamantane. Polymeric core units could include poly[(phenyl glycidyl ether)-co-formaldehyde], poly[(o-cresyl glycidyl ether)-co-formaldehyde], poly(glycidyl methacrylate), poly(bisphenol A-co-epichlorohydrin)-glycidyl end-capped, poly(styrene-co-glycidyl methacrylate), and poly(tert-butyl methacrylate-co-glycidyl methacrylate).

In one or more embodiments, the multi-functional epoxy compounds further comprise one or more crosslinkable chromophores bonded thereto, more preferably at least two crosslinkable chromophores bonded thereto, and even more preferably at least three crosslinkable chromophores bonded thereto. Suitable crosslinkable chromophores include substituted or unsubstituted light attenuating moieties, such as aromatics, aliphatics, sulfur- and/or halogen-containing compounds, and the like. The term "crosslinkable chromophores" refers to light attenuating moieties having crosslinkable groups that remain free (i.e., unreacted) after the chromophore is attached to the multi-functional epoxy compound. Thus, it will be appreciated that such crosslinkable groups should not react with the epoxy moieties on the multi-functional compound, so that they remain free in the resulting compound. In one or more embodiments, the crosslinkable chromophores will comprise from about 1 to 10 crosslinkable groups, and preferably from about 2 to 10 crosslinkable groups. In one or more embodiments, each multi-functional epoxy compound will comprise at least three chromophores bonded thereto, with each chromophore comprising at least one crosslinkable group. In other words, in preferred embodiments, the multi-functional epoxy compounds will comprise at least three crosslinkable sites. Particularly preferred crosslinkable groups include those that are reactive and crosslinkable with a vinyl ether crosslinker. Exemplary crosslinkable groups include hydroxy groups (—OH), phenolics (Ar—OH), and/or carboxylic acids (—COOH).

In one or more embodiments, the crosslinkable chromophores are bonded to the multi-functional epoxy compounds via respective epoxy moieties. Thus, in addition to crosslinkable groups, such chromophores will be further substituted (before bonding with the multi-functional epoxy compound) with at least one epoxy reactive site, such as a carboxylic acid, phenol, alcohol, thiol, and/or amine portion. In one or more embodiments, suitable chromophores will have no more than two epoxy reactive sites. It will be appreciated that the chromophore can be bonded to an epoxy moiety as part of the ring-opening reaction. Alternatively, the chromophore can be subsequently bonded to the epoxy moiety via the free hydroxyl group in the ring-opened moiety (i.e., after ring opening). Thus, in some embodiments, two chromophores may be bonded to the multi-functional epoxy compound via the same epoxy moiety.

Exemplary chromophore precursors for bonding with the multi-functional epoxy compounds include 1-hydroxy-2-naphthoic acid, 2-hydroxy-1-naphthoic acid, 6-hydroxy-2-naphthoic acid 3-hydroxy-2-naphthoic acid, 1,4-dihydroxy-2-naphthoic acid, 3,5-dihydroxy-2-naphthoic acid, 3,7-dihydroxy-2-naphthoic acid, 1,11-methylene-bis(2-hydroxy-3-naphthoic acid), 2,3-dihydroxybenzoic acid, 2,4-dihydroxybenzoic acid, 2,6-dihydroxybenzoic acid, 3,4-dihydroxybenzoic acid, 3,5-dihydroxybenzoic acid, 3,5-dihydroxy-4-methylbenzoic acid, 3-hydroxy-2-anthracenecarboxylic acid, 1-hydroxy-2- anthracenecarboxylic acid, 3-hydroxy-4-methoxymandelic acid, gallic acid, and 4-hydroxybenzoic acid.

The chromophore precursors are reacted with the selected core unit precursor in the presence of a catalyst to form the multi-functional epoxy compound. Suitable catalysts include base (organic/inorganic), acid (organic/inorganic), quaternary ammonium salts, and metal catalysts, as well as phase transfer agents, such as ammonium salts (e.g., benzyltriethylammonium chloride, benzyltrimethylammonium chloride), phosphonium salts, and the like. Preferably, the precursors are reacted with a catalyst in a suitable solvent while heating to temperatures of from about 100 to about 150° C. (and preferably from about 115 to about 125° C.), for a time period of from about 5 to about 30 hours (and preferably from about 15 to about 24 hours). In one or more embodiments, the reaction mixture is then filtered through an ion exchange resin to remove any residual catalyst. Preferably, the reaction mixture is mixed with ion exchange resins for a time period of from about 1 to about 10 hours (and preferably from about 2 to about 6 hours). The ion exchange resins are then removed from the reaction mixture through filtration. The resulting multi-functional epoxy compound can then be precipitated and/or dried, or the mother liquor can be used directly to prepare the anti-reflective compositions, described in more detail below. Regardless, removal of any residual catalyst from the multi-functional epoxy compound will advantageously reduce defects in the final device when using the anti-reflective composition in microelectronics fabrication.

In one or more embodiments, the multi-functional epoxy compound comprises at least one epoxy moiety of the formula:

or wherein * is the attachment point to the compound, each y is 0 or 1, each X is a crosslinkable chromophore (described above), each L is individually an amino, ether, thio (thio-ether), hydrazine, sulfinate, sulfonate, sulfonamide, ester, carbonate, carbamate, amide, or urea linkage, each R, when present, is individually an oxygen atom or —$CH_2$—, and each $R_1$ is individually an —H, alkyl, sulfonate, ester, carbonate, carbamate, or functionalized derivative thereof. In one or more embodiments, L is preferably an ester linkage. In one or more embodiments, R, when present, is —O—.

It will be appreciated that not all epoxy moieties on the multi-functional compound will be react (ring-opened). However, it is preferable that a majority (and more preferably, substantially all) of the epoxy moieties are reacted, where "a majority" means that greater than about 50% are reacted, while "substantially all" means that greater than about 95% of the epoxy moieties are reacted. It is particularly preferred that the epoxy moieties are reacted with a chromophore, and preferably a crosslinkable chromophore. For example, in one or more embodiments, at least about 50% of the epoxy moieties are occupied (reacted) with a chromophore, preferably at least about 75%, and more preferably at least about 95%, based upon the total number of epoxy moieties on all of multi-functional epoxy compounds in the composition taken as 100%. In some embodiments, at least about 98% of the epoxy moieties are reacted with a chromophore. In some embodiments, the multi-functional epoxy compound consists essentially of or even consists of a core unit having at least two epoxy moieties and at least one crosslinkable chromophore bonded thereto. In other words, in particular preferred embodiments, the light absorbing compound and crosslinkable site are preferably present on the same unit in the compound, as opposed to prior art compounds that contain a crosslinkable site on one monomer or compound and a chromophore on a different monomer or compound.

As noted above, the epoxy moieties are pendant from a core unit, which can be polymeric or nonpolymeric. In one or more embodiments, the core unit comprises (consists essentially or even consists of) recurring monomers of:

where each $R_2$ is individually an epoxy moiety, and in some embodiments, each $R_2$ is individually a ring-opened epoxy moiety as defined above. Polymeric compounds can be homopolymers, or can further comprise co-monomers of styrenics, acrylates (e.g., t-butyl methacrylate), t-butoxycarbonyls, adamantyl methacrylate, combinations thereof, and/or derivatives thereof, including acid-labile groups capable of producing a base-soluble moiety after deprotection.

In one or more embodiments, the core unit comprises (consists essentially or even consists of) recurring monomers of:

where each y is 0 or 1; each Ar is a polymerized aryl group (e.g., phenyl) each $R_2$ is individually an epoxy moiety, and in some embodiments; each $R_2$ is individually a ring-opened epoxy moiety as defined above; and each $R_3$, when present, is —$CH_2$—.

In one or more embodiments, the core unit comprises (consists essentially or even consists of) central nonpolymeric cores of:

where each n is 1-10,000 (preferably 2-2,000), each $R_2$ is individually an epoxy moiety, and in some embodiments; each $R_2$ is individually a ring-opened epoxy moiety as defined above; and the central core represented by the circle structure is selected from the group consisting of cyclic, acyclic, aliphatic, and aromatic compounds, and derivatives thereof, and preferably is selected from the group consisting of:

In one or more embodiments, the multi-functional epoxy compound is selected from the group consisting of non-polymeric small molecules, homopolymers, and copolymers of no more than two different co-monomers. In other words, in some embodiments, terpolymers, quaterpolymers, and the like are preferably excluded from use in the invention.

Regardless of the embodiment, the multi-functional epoxy compounds can be utilized to make compositions for use in microlithographic processes, such as anti-reflective coatings. The compositions are formed by simply dispersing or dissolving the multi-functional epoxy compound(s) in a suitable solvent system, preferably at ambient conditions and for a sufficient amount of time to form a substantially homogeneous mixture. Preferred compositions comprise from about 0.2 to about 50% by weight of the multi-functional epoxy compound, preferably from about 0.2 to about 10% by weight of the multi-functional epoxy compound, and more preferably from about 0.2 to about 4% by weight of the multi-functional epoxy compound, based upon the total weight of the composition taken as 100% by weight. As noted above, the multi-functional epoxy compounds are preferably filtered before use in the anti-reflective compositions. Thus, the level of unreacted catalyst in the compositions is substantially decreased. In one or more embodiment, the anti-reflective compositions will comprise less than about 0.01% by weight residual catalyst, and more preferably less than about 0.001% by weight catalyst, based upon the total weight of the composition taken as 100% by weight.

The solvent system can include any solvent suitable for use in microelectronics manufacturing. Preferably, the solvent system has a boiling point of from about 100° C. to about 200° C. In one or more embodiments, the solvent system will comprise a solvent selected from the group consisting of propylene glycol monomethyl ether (PGME), propylene glycol monomethyl ether acetate (PGMEA), ethyl lactate, propylene glycol n-propyl ether (PnP), cyclohexanone, gamma butyrolactone (GBL), and mixtures thereof. The solvent system is preferably used in the composition at a level of from about 75 to about 99.8% by weight, and preferably from about 95 to about 99.5% by weight, based upon the total weight of the composition taken as 100% by weight. The total solids in the composition should range from about 0.2 to about 25% by weight, and preferably from about 0.5 to about 5% by weight, based upon the total weight of the composition taken as 100% by weight.

The composition also preferably comprises a crosslinking agent. In some embodiments, the composition consists essentially of, or even consists of, the multi-functional epoxy compound dispersed or dissolved in a solvent system along with a crosslinking agent. Particularly preferred crosslinking agents are vinyl ether crosslinkers. It is particularly preferred that the crosslinkers be multi-functional (e.g., di-, tri-, and tetra-functional). The crosslinker is preferably present in the composition at a level of from about 0.1% to about 10% by weight, and preferably from about 0.2% to about 1% by weight, based upon the total weight of the composition taken as 100% by weight.

More preferably, exemplary vinyl ether crosslinkers have the formula where R' is selected from the group consisting of aryls (preferably $C_6$-$C_{14}$) and alkyls (preferably $C_1$-$C_{18}$, and more preferably $C_1$-$C_{10}$), each $R_4$ is individually selected from the group consisting of alkyls (preferably $C_1$-$C_{18}$, and more preferably $C_1$-$C_{10}$), alkoxys (preferably $C_1$-$C_{18}$, and more preferably $C_1$-$C_{10}$), carbonyls, and combinations of two or more of the foregoing, and n is at least 2, and preferably from 2-6. The most preferred vinyl ethers include those selected from the group consisting of ethylene glycol vinyl ether, trimethylolpropane trivinyl ether, 1,4-cyclohexane dimethanol divinyl ether, and mixtures thereof. Another preferred vinyl ether has a formula selected from the group consisting of The anti-reflective compositions can also further comprise additional optional ingredients such as acid generators (e.g., photoacid generators ("PAGs"), thermal acid generators ("TAGs")), base quenchers, surfactants, diffusion promoters, buffers, and the like. For example, PAGs can be selected that are ionic or non-ionic, provided that they are sensitive to 193-nm and/or 248-nm and/or 365-nm radiation. Ionic PAGs can be selected from those containing sulfonium and/or iodonium salts. Counter ions can be selected from triflate, nonaflate, methide, imide, camphorsulfonate, or others capable of generating a strong acid upon exposure to radiation. Non-ionic PAGs can include triazines, naphthylimides, diazomethane, disulfones, and/or sulfonates. When present, the PAG should be utilized in the compositions at a level of from about 0.01% to about 0.5% by weight, based upon the total weight of the composition taken as 100% by weight. In some embodiments, the anti-reflective composition consists essentially of, or even consists of, the multi-functional epoxy compound dispersed or dissolved in a solvent system along with a crosslinking agent and a PAG. In some embodiments, the anti-reflective compositions are preferably substantially free of acid generators (PAGs and/or TAGs). That is, the anti-reflective compositions preferably comprise less than about 0.01% by weight acid generator, more preferably less than about 0.005% by weight acid generator, and more preferably about 0% by weight of acid generator. In such embodiments, as noted above, the anti-reflective coating relies on acid diffusion from other layers in the stack to initiate the decrosslinking reaction to render the composition developer-soluble.

Quenchers for use in the invention can be selected from amine containing groups such as triethanolamine or trioctylamine. Other quenchers can be t-boc-protected, such as t-boc-protected amino acids, photobase generators, or photodegradable bases. When present, the quencher should be utilized in the compositions at a level of from about 0.001% to about 2% by weight, and preferably from about 0.01% to about 0.5% by weight, based upon the total weight of the composition taken as 100% by weight. The anti-reflective compositions can also be substantially free of quenchers. In such embodiments, the composition preferably comprises less than about 0.0001% by weight quencher, more preferably less than about 0.00005% by weight quencher, and even more preferably about 0% by weight quencher, based upon the total weight of the composition taken as 100% by weight.

Additional ingredients that are preferably excluded from the anti-reflective compositions, include other polymers or oligomers besides the multi-functional epoxy compound, binder resins, and the like.

As previously mentioned, the compositions are particularly useful as developer-soluble anti-reflective coatings in microelectronics fabrication. For example, an anti-reflective coating can be formed by applying a quantity of the anti-reflective composition to a microelectronic substrate to form a layer of the composition on the substrate surface. The composition may be applied directly to the substrate surface, or to uppermost layer of one or more optional intermediate underlayers that have been formed on the substrate surface. Suitable intermediate underlayers include those selected from the group consisting of carbon-rich layers (e.g., spin-on carbon layers (SOC), amorphous carbon layers), planarization layers, silicon hardmask layers, gap-filling layers, and combinations of the foregoing. The term "carbon-rich," as used herein, refers to compositions comprising greater than about 50% by weight carbon, preferably greater than about 70% by weight carbon, and more preferably from about 75 to about 80% by weight carbon, based upon the total solids in the composition taken as 100% by weight.

Any microelectronic substrate can be used in the invention. Preferred substrates include those selected from the group consisting of silicon, SiGe, $SiO_2$, $Si_3N_4$, aluminum, tungsten, tungsten silicide, gallium arsenide, germanium, tantalum, tantalum nitride, coral, black diamond, phosphorous or boron doped glass, ion implant layers, titanium nitride, hafnium oxide, silicon oxynitride, and mixtures of the foregoing. The composition can be applied by any known application method, with one preferred method being spin-coating the composition at speeds of from about 750 rpm to about 5,000 rpm (preferably from about 750 rpm to about 4,000 rpm, and more preferably from about 1,000 rpm to about 3,500 rpm) for a time period of from about 20 seconds to about 90 seconds (preferably from about 30 seconds to about 60 seconds). The substrate can have a planar surface, or it can include topography features (via holes, trenches, contact holes, raised features, lines, etc.). As used herein, "topography" refers to the height or depth of a structure in or on a substrate surface. For example, the substrate can comprise structure defining a hole, which includes sidewalls and a bottom wall. Thus, the method of applying the anti-reflective composition to the substrate would preferably include applying the composition to at least a portion of those hole sidewalls and bottom wall.

After the desired coverage is achieved, the composition is then heated to induce thermal crosslinking to form a cured anti-reflective coating. The layer is preferably heated to temperatures of at least about 80° C., preferably from about 125° C. to about 230° C., and more preferably from about 130° C. to about 205° C., and for a time period of from about 5 seconds to about 90 seconds (preferably from about 30 seconds to about 60 seconds). Advantageously, curing of the anti-reflective layer involves crosslinking of the multi-functional epoxy compounds in the composition. It will be appreciated that crosslinking of the multi-functional epoxy compounds can occur through the crosslinkable groups on the chromophores in the compound, as well as through the free —OH groups on the ring-opened epoxy moieties. The present invention involves thermal crosslinking and does not require an acid or TAG to initiate crosslinking of the compound. Acid generators, if present in the composition, would only be involved in decrosslinking the compound, as discussed in more detail below.

The average thickness of the anti-reflective layer after baking is preferably from about 20 nm to about 100 nm, more preferably from about 20 nm to about 75 nm, and even more preferably from about 20 nm to about 60 nm. If the substrate surface includes topography, the anti-reflective coating is preferably applied at a thickness sufficient to substantially cover the substrate topography at these thicknesses. The average thickness is defined as the average of 5 measurements across the substrate taken by an ellipsometer.

Cured layers according to the invention will be substantially insoluble in solvents (e.g., ethyl lactate, PGME) typically utilized in photoresists. Thus, when subjected to a stripping test, the inventive coating will have a percent stripping of less than about 5%, preferably less than about 1%, and even more preferably about 0%. The stripping test involves first determining the average thickness (by taking the average of measurements at five different locations) of a cured layer. This is the average initial film thickness. Next, a solvent (e.g., PGME) is puddled onto the cured film for about 20 seconds, followed by spin drying at about 3,000 rpm for about 30 seconds to remove the solvent. The thickness is measured again at five different points on the wafer using ellipsometry, and the average of these measurements is determined. This is the average final film thickness.

The amount of stripping is the difference between the initial and final average film thicknesses. The percent stripping is:

$$\% \text{ stripping} = \left(\frac{\text{amount of stripping}}{\text{initial average film thickness}}\right) \times 100.$$

The cured anti-reflective coating is also preferably substantially insoluble in typical photoresist developers (e.g., tetramethylammonium hydroxide (TMAH)). The solubility of the inventive film in developer is evaluated using the same procedure and calculation as that for the stripping test described above, except that instead of a photoresist solvent, an alkaline developer is used. The crosslinked layer is also subjected to a PEB at 110° C. for 60 seconds. Next, 0.26 N TMAH developer is puddled onto the layer for 45 seconds, followed by a 5-second deionized water rinse, and a spin dry. Any loss of thickness in the cured layer is defined as the "dark loss." The cured layer will have a dark loss of less than about 5%, preferably less than about 1.5%, more preferably less than about 1%, even more preferably less than about 0.8%, and most preferably about 0%.

The wet development of the film can also be evaluated using a similar procedure and calculation as that for the stripping test. The cured layer is first exposed at 20 mJ/cm$^2$ with broadband light on an Oriel™ DUV broadband exposure unit. The exposed layer is then subjected to a PEB at 130° C. for 90 seconds. A photoresist developer (0.26 N TMAH) is then puddled onto the film for 60 seconds, followed by a 5-second deionized water rinse while spinning at 300 rpm, and then spin drying at about 3,000 rpm for about 30 seconds to remove the developer. The thickness of the layer is measured again, and the % development is calculated. The photosensitive, developer-soluble anti-reflective coating (with PAG) will preferably have a % development of from about 95% to about 100%, and more preferably from about 99% to about 100%.

The n value (the real component of the complex index of refraction) of the cured anti-reflective coating will be at least about 1.3, preferably from about 1.4 to about 2, more preferably from about 1.45 to about 1.8, and even more preferably from about 1.5 to about 1.75. The anti-reflective coating also preferably has a k value (the imaginary component of the complex index of refraction) of at least about 0.2, preferably from about 0.25 to about 0.65, and more preferably from about 0.3 to about 0.6, at the wavelength of use (e.g., 193 nm, 248 nm, or 365 nm).

A photosensitive composition can then be applied to the inventive layer, followed by a post-application bake (PAB), to form an imaging layer. The thickness of the imaging layer will typically range from about 50 nm to about 2,000 nm. Suitable imaging compositions include commercially-available photoresists (e.g., TarF-Pi6-001 from TOK, Kawasaki shi, Kanagawa (Japan); ARX3001JN, ARX3340J, and AM2073J, from JSR Micro, Sunnyvale, Calif.; SAIL-X-181, Shin-Etsu, Tokyo (Japan)), or any other photosensitive compositions. Where the anti-reflective coating composition is not intrinsically photosensitive (i.e., a PAG-less anti-reflective coating), suitable photosensitive compositions will preferably comprise an acid generator (preferably a PAG) and be capable of generating sufficient acid for decrosslinking and deprotecting the adjacent anti-reflective coating to render it developer-soluble, as explained in more detail below. Advantageously, anti-reflective coatings according to the invention can be used to form thin layers, such that acid diffusion from an adjacent photoresist is able to diffuse throughout the entire thickness of the anti-reflective coating, such that the pattern can be cleared down to the substrate or intermediate layer, when present.

The imaging layer can be patterned by exposure to light of the appropriate wavelength (193 nm-365 nm) through a mask, followed by a post-exposure bake (PEB), and development of the pattern. Suitable developers are organic or inorganic alkaline solutions such as potassium hydroxide (KOH), TMAH, and preferably comprise an aqueous solution of TMAH at a concentration of 0.26N or lower. Some of these developers are commercialized under the tradenames PD523AD (available from Moses Lake Industries, Inc., Moses Lake, Wash.), MF-319 (available from Dow Chemical), MF-320 (available from Shipley), and NMD3 (available from TOK, Japan).

In another embodiment, ArF immersion lithography can be used to pattern the imaging layer. Instead of air (as in conventional lithography), the medium through which the radiation passes during exposure is a liquid. The imaging layer is exposed to radiation via an optical projection element (i.e., lens) of a lithographic system, with the immersion liquid contacting at least a portion of the optical element of the lithographic system and a portion of the structure (i.e., the stack). Even more preferably, the liquid fills the space between the last optical element in the system and the imaging layer, such that the optical element is immersed in the liquid. Suitable immersion liquids preferably have a refractive index greater of than 1 (preferably from about 1 to about 2, and more preferably from about 1.3 to about 1.4), and are selected from the group consisting of water (preferably purified water) or organic solvents. Immersion lithography systems are known in the art and include the Amphibian Interferometer from Amphibian™ Systems (Rochester, N.Y.), and the 1900i from ASML (Veldhoven, Netherlands).

Regardless, the imaging layer can be patterned by exposure to light of the appropriate wavelength, followed by development and selective removal of the exposed areas of the imaging layer (in the case of positive-working imaging layers). Advantageously, as the imaging layer is exposed to light, so is the inventive anti-reflective coating. Upon exposure to light, an acid is generated from the acid generator (either in the anti-reflective coating itself or from the imaging layer), and this acid "decrosslinks" the multi-functional epoxy compound and vinyl ether crosslinker in the anti-reflective coating layer. That is, even where the anti-reflective coating is not intrinsically photosensitive, the exposed portions of the anti-reflective coating are still rendered developer-soluble upon exposure to light by acid diffusing from the exposed portions of the imaging layer into the corresponding portions of the anti-reflective coating adjacent the imaging layer. The acid (whether from the imaging layer or anti-reflective coating) breaks the bond that was formed between the multi-functional epoxy compound and the crosslinker, and specifically between the crosslinkable chromophore and crosslinker, in the anti-reflective coating upon thermal crosslinking. Decrosslinking regenerates the multi-functional epoxy compound including the crosslinkable groups on the chromophore rendering the composition developer-soluble.

The exposed portions of the imaging layer and anti-reflective coating which were made soluble by the above process, are then contacted with a developer to remove the exposed portions. The exposed portions of the anti-reflective coating underneath the exposed portions of the imaging layer are removed by the developer as the imaging layer is removed so as to simultaneously for in the desired pattern in the imaging layer and anti-reflective coating layer. The pattern can be via holes, trenches, lines, spaces, etc., that will ultimately be transferred to the substrate using a wet and/or dry etch and/or ion implantation process. Preferably, at least about 95% of the exposed portions of the anti-reflective coating will be removed by the developer, more preferably at least about 99%, and even more preferably about 100% will be removed. The present coatings provide a distinct advantage in that they are substantially completely decrosslinked upon exposure and baking such that the resulting pattern is cleared entirely down to the substrate or intermediate layer, when present. In other words, the exposed portions of the anti-reflective coating are preferably completely removed with very little anti-reflective composition residue remaining in the patterned features. In particular, less than about 5 nm of anti-reflective coating thickness remaining in exposed portions, preferably less than about 1 nm, even more preferably less than 0.5 nm anti-reflective coating thickness remaining in the exposed portions.

In one or more embodiments, because the exposed portions anti-reflective layer become developer soluble after exposure as described above, an opening is formed in the anti-reflective layer during development of the imaging layer. Thus, lithographic patterning of the imaging layer forms openings (such as a contact hole, via hole, trench, etc.) in both the imaging layer and the anti-reflective layer. The openings are in communication with one another (i.e., aligned to at least some extent so that substrate, or intermediate layer, if present, is uncovered or exposed). Further processing can then be carried out on the exposed portions of the substrate or intermediate layer, or the pattern can be transferred down into the substrate surface.

For example, ions can be implanted into the exposed substrate. For ion implantation, ions are generated from a dopant by an ion source using known processes. Some preferred ions for use with the present invention are those selected from the group consisting of ions of the elements of Groups III-V of the Periodic Table, with ions of boron, nitrogen, phosphorus, arsenic, boron difluoride, indium, antimony, germanium, silicon, carbon, and gallium being particularly preferred. Other preferred ions are selected from the group consisting of hydrogen, argon, beryllium, fluorine, oxygen, and helium. The generated ions are accelerated at energy levels sufficiently high that the ions will penetrate the substrate. Preferred energy levels are from about 1 eV to about 20 MeV, preferably from about 5 KeV to about 2,000 KeV, and more preferably from about 20 KeV to about 500 KeV. Typical ion doses would be from about 10 atoms/cm$^2$ to about 10e$^{30}$ atoms/cm$^2$, and preferably from about 1e$^{12}$ atoms/cm$^2$ to about 1e$^{16}$ atoms/cm$^2$. The accelerated ions are focused by known processes. One such process involves using a series of electrostatic and magnetic lenses until the beam reaches the desired diameter. The beam is then directed at the substrate. As will be understood by those skilled in this art, the angle of the beam can be adjusted to control ion depth in the substrate. The unexposed portions of the imaging layer and anti-reflective layer that remain after development serve to protect areas of substrate where ions are not desired, while the openings of the pattern provide access to the substrate by the ions. As a result, an implant area can be formed in the substrate that corresponds to the pattern. It will be appreciated that the number, size, and shape of the openings can be adjusted as necessary to implant ions in the substrate in the locations appropriate for the end use.

Additional advantages of the various embodiments of the disclosure will be apparent to those skilled in the art upon review of the disclosure herein and the working examples below. It will be appreciated that the various embodiments described herein are not necessarily mutually exclusive unless otherwise indicated herein. For example, a feature described or depicted in one embodiment may also be included in other embodiments, but is not necessarily included. Thus, the present invention encompasses a variety of combinations and/or integrations of the specific embodiments described herein. In addition, while the drawings illustrate, and the specification describes, certain preferred embodiments, it is to be understood that such disclosure is by way of example only.

As used herein, the phrase "and/or," when used in a list of two or more items, means that any one of the listed items can be employed by itself or any combination of two or more of the listed items can be employed. For example, if a composition is described as containing or excluding components A, B, and/or C, the composition can contain or exclude A alone; B alone; C alone; A and B in combination; A and C in combination; B and C in combination; or A, B, and C in combination.

The present description also uses numerical ranges to quantify certain parameters relating to various embodiments of the invention. It should be understood that when numerical ranges are provided, such ranges are to be construed as providing literal support for claim limitations that only recite the lower value of the range as well as claim limitations that only recite the upper value of the range. For example, a disclosed numerical range of about 10 to about 100 provides literal support for a claim reciting "greater than about 10" (with no upper bounds) and a claim reciting "less than about 100" (with no lower bounds).

EXAMPLES

The following examples set forth methods in accordance with the invention. It is to be understood, however, that these examples are provided by way of illustration and nothing therein should be taken as a limitation upon the overall scope of the invention.

Example 1

Reaction of 2,3-tris(epoxypropyl)isocyanurate with 3,7-dihydroxy-2-naphthoic acid -continued A three-neck, 500 mL flask was equipped with a magnetic stir bar, a nitrogen inlet, a condenser with nitrogen outlet, and a thermometer. The flask was charged with 236.26 grams of cyclohexanone (Harcros Chemical, St. Louis, Mo.), 65.0625 grams of 3,7-dihydroxy-2-naphthoic acid (Sigma Aldrich, St. Louis, Mo.), 34.3125 grams of 2,3-tris (epoxypropyl)isocyanurate (Nissan Chemical Industries, Tokyo, Japan), and 1.8908 grams of benzyltriethylammonium chloride (BTEAC; Lancaster Synthesis, Ward Hill, Mass.). The reaction was heated to 120° C., stirred for 24 hours, and then cooled to ambient conditions. After cooling, the reaction product was mixed with 50.625 grams of AMBERSEP 200 H Resin (Rohm and Haas, Philadelphia, Pa.) and rotated for 4 hours. After 4 hours, the 200 H Resin was removed via filtration.

Example 2

Developer-soluble Bottom Anti-reflective Coating Formulation Using Compound from Example 1

A photosensitive bottom anti-reflective coating formulation was made using the compound from Example 1. The formulation was prepared by charging a 125 mL amber Nalgene bottle with 3.5587 grams of reaction product from Example 1, 0.4270 grams of vinyl ether crosslinker LIVELink™ (Brewer Science, Inc, Rolla, Mo.), 0.0053 grams of triethanolamine (Sigma Aldrich, St. Louis, Mo.), 94.56 grams of PGME (Harcros Chemical, St. Louis, Mo.), and 1.4489 grams of cyclohexanone. The mixture was tumbled overnight and then filtered through a 0.1 μm endpoint filter into a clean 125 mL amber Nalgene bottle.

The photosensitive bottom anti-reflective coating material was spin-coated at 1,500 rpm on a silicon wafer and then baked at 160° C. for 60 seconds. The film was rinsed with ethyl lactate (Harcros, St. Louis, Mo.) to test the film's solvent resistance and then immersed in photoresist developer, PD523AD (JSR Micro, Sunnyvale, Calif.) without exposure to evaluate the dark loss. On another prepared wafer, contrast curves were tested using an Oriel DUV broadband exposure tool and a 248-nm band pass filter. After contrast exposure, a PEB was done at 125° C. for 90 seconds, and the wafer was developed using PD523AD for 45 seconds, followed by rinsing with DI water for 5 seconds and spinning dry. Table 1 summarizes the results.

TABLE 1

|  | 20 second EL strip | Development without exposure (Dark Loss) | Exposure, PEB and development |
|---|---|---|---|
| Initial Thickness (nm) | 44.7 | 44.8 | 50.5 |
| Thickness after treatment (nm) | 43.7 | 44.3 | 0 |
| % change | 2.2 | 1.1 | 100 |

These results indicate that this material possesses good solvent resistance and minimal dark loss, while still being able to be completely removed in alkaline developer after exposure.

Figure 1:
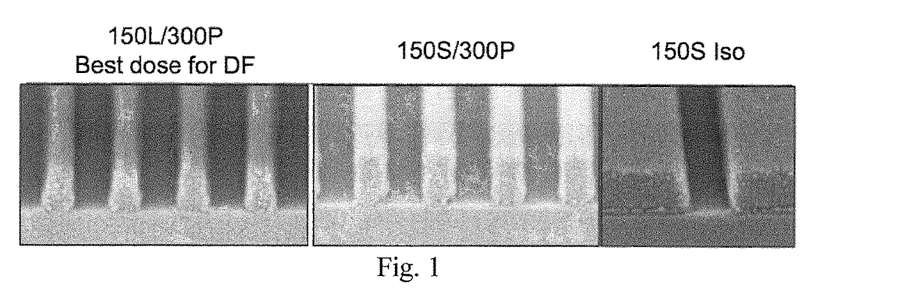
FIG. 1 shows scanning electron microscope (SEM) cross-section images of the lithography results for Example 2, showing 150 nm features.

The above formulations were then spin-coated onto silicon wafers and baked at 160° C. for 60 seconds. The anti-reflective coating was then coated with a photoresist for 248-nm lithography (JSR M529Y resist), with a PAB of 130° C. for 90 seconds and PEB of 125° C. for 90 seconds. FIG. 1 shows the lithographic results.

Example 3

Reaction of 3,7-dihydroxy-2-naphthoic acid with poly(phenyl glycidyl ether-co-formaldehyde)

A three-neck, 1,000 mL flask was equipped with a magnetic stir bar, a nitrogen inlet, a condenser with nitrogen outlet, and a thermometer. The flask was charged with 387.89 grams of cyclohexanone, 87.11 grams of 3,7-dihydroxy-2-naphthoic acid, 76.75 grams of poly(phenyl glycidyl ether-co-formaldehyde) (Sigma Aldrich, St. Louis, Mo.), and 2.38 grams of benzyltrimethylammonium chloride (BTMAC; Sigma Aldrich, St. Louis, Mo.). The reaction was heated to 120° C. and stirred for 24 hours, then cooled to ambient conditions. After cooling, the reaction product was mixed with 83.1195 grams of AMBERSEP 200 H Resin and 83.1195 grams of Dowex 550A Resin (Sigma Aldrich, St. Louis, Mo.) and rotated for 24 hours. After 24 hours, the resins were removed via filtration.

Example 4

Developer-soluble Bottom Anti-reflective Coating Formulation Using Polymer from Example 3

A photosensitive bottom anti-reflective coating formulation was made using the polymer from Example 3. The formulation was prepared by charging a 125 mL amber Nalgene bottle with 3.5638 grams of reaction product from Example 3, 0.4277 grams of vinyl ether crosslinker LIVELink™, 0.0032 grams of triethanolamine, 94.56 grams of PGME, and 1.4489 grams of cyclohexanone. The mixture was tumbled overnight and then filtered through a 0.1 µm end-point filter into a clean 125 mL amber Nalgene bottle.

The photosensitive bottom anti-reflective coating was spin-coated at 1,500 rpm onto a silicon wafer and then baked at 160° C. for 60 seconds. The film was rinsed with ethyl lactate to test the film's solvent resistance and then immersed in photoresist developer, PD523AD, without exposure, to evaluate the dark loss. On another prepared wafer, a photoresist, JSR M529Y was spin-coated at 1,500 rpm on top of the photosensitive bottom anti-reflective coating and then baked at 130° C. for 90 seconds. Contrast curves were tested using an Oriel DUV broadband exposure tool and a 248-nm band pass filter. After contrast exposure, a PEB was done at 125° C. for 90 seconds, and the wafer was developed using PD523AD for 45 seconds, followed by rinsing with DI water for 5 seconds and spinning dry. Table 2 summarizes the results.

TABLE 2

|  | 20 second EL strip | Development without exposure (Dark Loss) | Exposure, PEB and development (with resist) |
|---|---|---|---|
| Initial Thickness (nm) | 44.8 | 44.7 | 260.4 |
| Thickness after treatment (nm) | 45.2 | 45.5 | 0 |
| % change | −0.9 | −1.8 | 100 |

The results indicate that this material possesses good solvent resistance and minimal dark loss, while still being able to be completely removed in alkaline developer after exposure.

Figure 2:
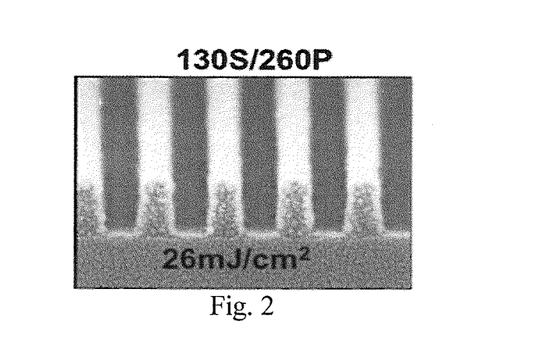
FIG. 2 is an SEM cross-section image of lithography results for Example 4, showing 130 nm features.

The above formulations were then spin-coated onto silicon wafers and baked at 160° C. for 60 seconds. The anti-reflective coating was then coated with a photoresist for 248-nm lithography (JSR M529Y resist), with a PAB of 130° C. for 90 seconds and PEB of 125° C. for 90 seconds. FIG. 2 shows the lithographic results.

Example 5

Polymerization of glycidyl methacrylate and styrene, then attachment of 3,7-dihydroxy-2-naphthoic acid A three-neck, 250-mL flask was equipped with a magnetic stir bar, a nitrogen inlet, a condenser with nitrogen outlet, and a thermometer. Poly(glycidyl methacrylate-co-styrene) was prepared by charging the flask with 115.00 grams of cyclohexanone, 25.0 grams of styrene (Sigma Aldrich, St. Louis, Mo.), 50.0 grams of glycidyl methacrylate (Sigma Aldrich, St. Louis, Mo.), 1.875 grams of 1-dodecanethiol, and 3.75 grams of 2,2'-azobis(2-methylpropionitrile) (Sigma Aldrich, St. Louis, Mo.). The reaction was heated to 75° C. and stirred for 18 hours, then cooled to ambient conditions. After cooling, the polymer was precipitated into 50/50 blend of ethanol and n-hexanes (Sigma Aldrich, St. Louis, Mo.), then dried in vacuum oven at 40° C. for 48 hours.

A second three-neck, 250-mL flask equipped with a magnetic stir bar, a nitrogen inlet, a condenser with nitrogen outlet, and a thermometer, was then charged with 23.50 grams of dried prepared poly(glycidyl methacrylate-co-styrene), 20.23 grams of 3,7-dihydroxy-2-naphthoic acid, 0.146 grams of benzyltrimethylammonium chloride (Sigma Aldrich, St. Louis, Mo.), and 102.0 grams of cyclohexanone. The reaction was heated to 120° C. and stirred for 16 hours. Once cooled, 100.0 grams of reaction product was diluted with 20.0 grams of cyclohexanone. The diluted solution was mixed with 18.0 grams of AMBERSEP 200 H Resin and 18.0 grams of Dowex 550A Resin (Sigma Aldrich, St. Louis, Mo.) for 24 hours. After 24 hours, the resins were removed via filtration.

Example 6

Developer-soluble Bottom Anti-reflective Coating Formulation Using Polymer from Example 5

A photosensitive bottom anti-reflective coating formulation was made using the polymer from Example 5. The formulation was prepared by charging a 60 mL amber Nalgene bottle with 2.2956 grams of reaction product from Example 5, 0.1722 grams of vinyl ether crosslinker LIVELink™, 0.0172 grams of TPS-C1 (Daychem Laboratories, Inc., Vandalia, Ohio), 0.0017 grams of triethanolamine, 41.5809 grams of PGME, and 0.9324 grams of cyclohexanone. The mixture was tumbled overnight and then filtered through a 0.1 µm end-point filter into a clean 60 mL amber Nalgene bottle.

The photosensitive bottom anti-reflective coating was spin-coated at 1,500 rpm on a silicon wafer and then baked at 160° C. for 60 seconds. The film was rinsed with ethyl lactate to test the film's solvent resistance and then immersed in photoresist developer, PD523AD, without exposure to evaluate the dark loss. On another prepared wafer, contrast curves were tested using an Oriel DUV broadband exposure tool and a 248 nm band pass filter. After contrast exposure, a PEB was done at 125° C. for 90 seconds, and the wafer was developed using PD523AD for 45 seconds, followed by rinsing with DI water for 5 seconds and spinning dry. Table 3 summarizes the results.

TABLE 3

| | 20 second EL strip | Development without exposure (Dark Loss) | Exposure, PEB and development (with resist) |
|---|---|---|---|
| Initial Thickness (nm) | 70.5 | 70.9 | 54.7 |
| Thickness after treatment (nm) | 69.9 | 72.4 | 0 |
| % change | 0.85 | −2.12 | 100 |

The results indicate that this material possesses good solvent resistance and minimal dark loss, while still being able to be completely removed in alkaline developer after exposure.

Figure 3:
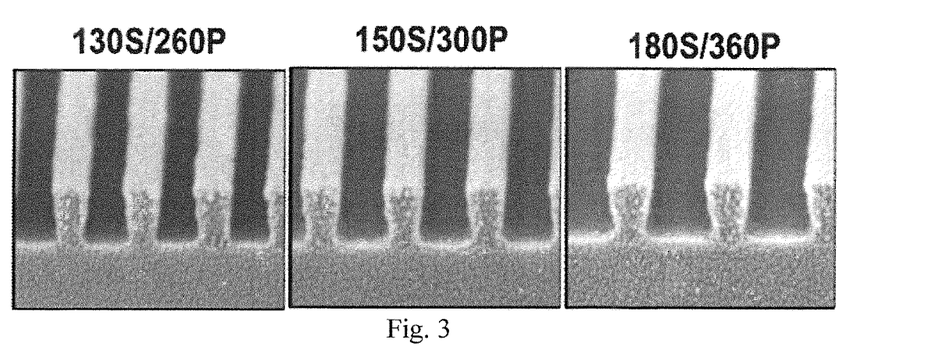
FIG. 3 shows SEM cross-section images of lithography results for Example 6, showing various feature sizes.

The photosensitive bottom anti-reflective coating formulation was spin-coated onto a silicon wafer and baked at 160° C. for 60 seconds. The anti-reflective coating was then coated with a photoresist for 248-nm lithography (JSR M529Y resist), with a PAB of 130° C. for 90 seconds and PEB of 125° C. for 90 seconds. FIG. 3 shows lithographic results.

Example 7

Polymerization of glycidyl methacrylate and styrene and attachment of 3,7-dihydroxy-2-naphthoic acid A three-neck, 250-mL flask was equipped with a magnetic stir bar, a nitrogen inlet, a condenser with nitrogen outlet, and a thermometer. The flask was charged with 120 grams of cyclohexanone, 17.78 of styrene, 56.64 grams of glycidyl methacrylate, 1.86 grams of 1-dodecanethiol, and 3.72 grams of 2,2'-azobis(2-methylpropionitrile). The reaction was heated to 75° C. and stirred for 18 hours, then cooled to ambient conditions. After cooling, the polymer mother liquor was bottled without any further processing.

A second three-neck 250-mL flask equipped with a magnetic stir bar, a nitrogen inlet, a condenser with nitrogen outlet, and a thermometer, was then charged with 64.73 grams of prepared poly(glycidyl methacrylate-co-styrene) mother liquor, 23.68 grams of 3,7-dihydroxy-2-naphthoic acid, 0.43 grams of benzyltrimethylammonium chloride, and 111.16 grams of cyclohexanone. The reaction was heated to 120° C. and stirred for 16 hours. Once cooled, the solution was mixed with 16.0 grams of AMBERSEP 200 H Resin and 16.0 grams of Dowex 550A Resin (Sigma Aldrich, St. Louis, Mo.) for 24 hours. After 24 hours, the resins were removed via filtration.

Example 8

Polymerization of glycidyl methacrylate and styrene, then attachment of 3,7-dihydroxy-2-naphthoic acid A three-neck, 250-mL flask was equipped with a magnetic stir bar, a nitrogen inlet, a condenser with nitrogen outlet, and a thermometer. The flask was charged with 120 grams of cyclohexanone, 11.52 grams of styrene, 62.90 grams of glycidyl methacrylate, 1.86 grams of 1-dodecanethiol, and 3.72 grams of 2,2'-azobis(2-methylpropionitrile). The reaction was heated to 75° C. and stirred for 18 hours, then cooled to ambient conditions. After cooling, the polymer mother liquor was bottled without any further processing.

A second three-neck, 250-mL flask equipped with a magnetic stir bar, a nitrogen inlet, a condenser with nitrogen outlet, and a thermometer was then charged with 61.46 grams of prepared poly(glycidyl methacrylate-co-styrene) mother liquor, 24.96 grams of 3,7-dihydroxy-2-naphthoic acid, 0.45 grams of benzyltrimethylammonium chloride, and 113.13 grams of cyclohexanone. The reaction was heated to 120° C. and stirred for 16 hours. Once cooled, the solution was mixed with 16.0 grams of AMBERSEP 200 H Resin and 16.0 grams of Dowex 550A Resin (Sigma Aldrich, St. Louis, Mo.) for 24 hours. After 24 hours, the resins were removed via filtration.

Example 9

Polymerization of glycidyl methacrylate homopolymer, then Attachment of 3,7-dihydroxy-2-naphthoic acid

A three-neck, 250-mL flask was equipped with a magnetic stir bar, a nitrogen inlet, a condenser with nitrogen outlet, and a thermometer. The flask was charged with 120 grams of cyclohexanone, 74.42 grams of glycidyl methacrylate, 1.86 grams of 1-dodecanethiol, and 3.72 grams of 2,2'-azobis(2-methylpropionitrile). The reaction was heated to 75° C. and stirred for 18 hours, then cooled to ambient conditions. After cooling, the polymer mother liquor was bottled without any further processing.

A second three-neck, 250-mL flask equipped with a magnetic stir bar, a nitrogen inlet, a condenser with nitrogen outlet, and a thermometer, was then charged with 56.22 grams of prepared poly(glycidyl methacrylate) mother liquor, 27.02 grams of 3,7-dihydroxy-2-naphthoic acid, 0.49 grams of benzyltrimethylammonium chloride, and 116.27 grams of cyclohexanone. The reaction was heated to 120° C. and stirred for 16 hours. Once cooled, 93.0 grams of cyclohexanone was added to the mother liquor to reduce the viscosity of the solution. The diluted solution was then mixed with 16.0 grams of AMBERSEP 200 H Resin and 16.0 grams of Dowex 550A Resin (Sigma Aldrich, St. Louis, Mo.) for 24 hours. After 24 hours, the resins were removed via filtration.

Example 10

Polymerization of glycidyl methacrylate and t-butyl methacrylate, then Attachment of 3,7-dihydroxy-2-naphthoic acid

A three-neck, 250-mL flask was equipped with a magnetic stir bar, a nitrogen inlet, a condenser with nitrogen outlet, and a thermometer. The flask was charged with 120 grams of cyclohexanone, 30.0 grams of t-butyl methacrylate (Sigma Aldrich, St. Louis, Mo.), 44.98 grams of glycidyl methacrylate, 1.67 grams of 1-dodecanethiol, and 3.35 grams of 2,2'-azobis(2-methylpropionitrile). The reaction was heated to 75° C. and stirred for 18 hours, then cooled to ambient conditions. After cooling, the polymer mother liquor was bottled without any further processing.

A second three-neck, 250-mL flask equipped with a magnetic stir bar, a nitrogen inlet, a condenser with nitrogen outlet, and a thermometer, was then charged with 71.84 grams of prepared poly(glycidyl methacrylate-co-t-butyl methacrylate) mother liquor, 20.89 grams of 3,7-dihydroxy-2-naphthoic acid, 0.38 grams of benzyltrimethylammonium chloride, and 106.89 grams of cyclohexanone. The reaction was heated to 120° C. and stirred for 16 hours. Once cooled, the solution was mixed with 16.0 grams of AMBERSEP 200 H Resin and 16.0 grams of Dowex 550A Resin (Sigma Aldrich, St. Louis, Mo.) for 24 hours. After 24 hours, the resins were removed via filtration.

Figure 4:
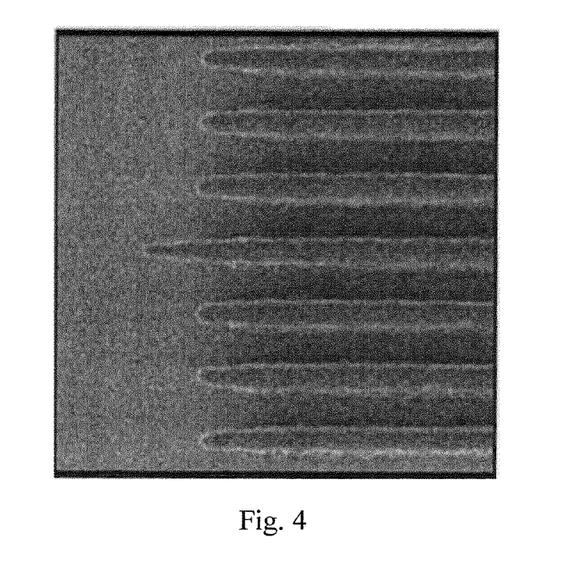
FIG. 4 is a top-down SEM image of the lithography results for Example 10, showing 130-nm features.

The prepared polymer was then used to formulate a photosensitive, developer-soluble bottom anti-reflective coating using the same procedure from Example 6. The anti-reflective composition was spin coated onto a silicon wafer and baked at 160° C. for 60 seconds, followed by 248-nm lithography using JSR M529Y resist, a PAB of 130° C. for 90 seconds, and PEB of 125° C. for 90 seconds. FIG. 4 shows the lithographic results.

Example 11

Polymerization of glycidyl methacrylate and p-tert-butoxycarbonyloxystyrene, then Attachment of 3,7-dihydroxy-2-naphthoic acid A three-neck, 250-mL flask was equipped with a magnetic stir bar, a nitrogen inlet, a condenser with nitrogen outlet, and a thermometer. The flask was charged with 120 grams of cyclohexanone, 38.54 grams of p-tert-butoxycarbonyloxystyrene (Dupont, Wilmington, Del.), 37.30 grams of glycidyl methacrylate, 1.39 grams of 1-dodecanethiol, and 2.78 grams of 2,2'-azobis(2-methylpropionitrile). The reaction was heated to 75° C. and stirred for 18 hours, then cooled to ambient conditions. After cooling, the polymer mother liquor was bottled without any further processing.

A second three-neck, 250-mL flask equipped with a magnetic stir bar, a nitrogen inlet, a condenser with nitrogen outlet, and a thermometer was then charged with 77.47 grams of prepared poly(glycidyl methacrylate-co-p-tert-butoxycarbonyloxystyrene) mother liquor, 18.68 grams of 3,7-dihydroxy-2-naphthoic acid, 0.34 grams of benzyltrimethylammonium chloride, and 103.52 grams of cyclohexanone. The reaction was heated to 120° C. and stirred for 16 hours. Once cooled, the solution was mixed with 16.0 grams of AMBERSEP 200 H Resin and 16.0 grams of Dowex 550A Resin (Sigma Aldrich, St. Louis, Mo.) for 24 hours. After 24 hours, the resins were removed via filtration.

Example 12

Photosensitive, Developer-soluble Bottom Anti-reflective Coating Formulation Using Polymer from Example 11

A photosensitive bottom anti-reflective coating formulation was made using the polymer from Example 11. The formulation was prepared by charging a 60 mL amber Nalgene bottle with 2.2472 grams of reaction product from Example 11, 0.1685 grams of vinyl ether crosslinker LIVELink™, 0.0169 grams of TPS-C1 (Daychem Laboratories, Inc., Vandalia, Ohio), 0.0028 grams of triethanolamine, 46.2950 grams of PGME, and 1.2696 grams of cyclohexanone. The mixture was tumbled overnight and then filtered through a 0.1 μm end-point filter into a clean 60 mL amber Nalgene bottle.

The photosensitive bottom anti-reflective coating was spin-coated at 1,500 rpm onto a silicon wafer and then baked at 160° C. for 60 seconds. The film was rinsed with ethyl lactate to test the film's solvent resistance and then immersed in photoresist developer, PD523AD, without exposure to evaluate the dark loss. On another prepared wafer, contrast curves were tested using an Oriel DUV broadband exposure tool and a 248-nm band pass filter. After contrast exposure, a PEB was done at 125° C. for 90 seconds, and the wafer was developed using PD523AD for 45 seconds, followed by rinsing with DI water for 5 seconds and spinning dry. Table 4 summarizes the results.

TABLE 4

|  | 20 second EL strip | Development without exposure (Dark Loss) | Exposure, PEB and development (with resist) |
|---|---|---|---|
| Initial Thickness (nm) | 43.6 | 39.4 | 42.8 |
| Thickness after treatment (nm) | 42.8 | 40.7 | 0 |
| % change | 1.83 | −3.30 | 100 |

The results indicate that this material possesses good solvent resistance and minimal dark loss, while still being able to be completely removed in alkaline developer after exposure.

Figure 5:
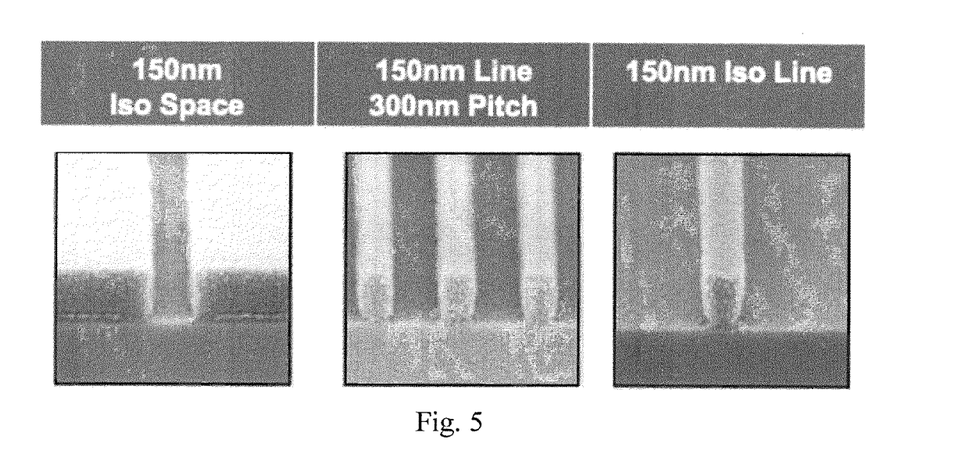
FIG. 5 shows SEM cross-section images of the lithography results for Example 12, showing various feature sizes.

The photosensitive bottom anti-reflective coating formulation was spin-coated onto a silicon wafer and baked at 160° C. for 60 seconds. The anti-reflective coating was then coated with a photoresist for 248-nm lithography (JSR M529Y resist), with a PAB of 130° C. for 90 seconds and PEB of 125° C. for 90 seconds. FIG. 5 shows the lithographic results.

We claim:

1. A method of forming a microelectronic structure, said method comprising:
   (a) providing a substrate having a surface;
   (b) forming a photosensitive, developer-soluble anti reflective layer on said surface, said anti-reflective layer being formed from an anti-reflective composition comprising a polymeric multi-functional epoxy compound and a separate vinyl ether crosslinker dispersed or dissolved in a solvent system, wherein said polymeric multi-functional epoxy compound comprises a polymeric core unit derived from a co-polymer selected from the group consisting of poly[(phenyl glycidyl ether)-co-formaldehyde], poly[(o-cresyl glycidyl ether)-co-formaldehyde], poly(bisphenol) A-co-epichlorohydrin)-glycidyl end-capped, poly(styrene-co-glycidyl methacrylate), poly(p-tert-butoxycarbonyloxystryene-co-glycidyl methacrylate), and poly(tert-butyl methacrylate-co-glycidyl methacrylate), wherein said polymeric multi-functional epoxy compound comprises at least one crosslinkable chromophore bonded thereto, said crosslinkable chromophore comprising from about 2 to 10 crosslinkable groups, wherein said anti-reflective composition comprises 0% by weight of acid generators, based upon the total weight of the composition taken as 100% by weight; and
   (c) forming an imaging layer on said anti-reflective layer.

2. The method of claim 1, said method further comprising thermally crosslinking said anti-reflective layer after said forming (b), wherein said crosslinking yields an anti-reflective layer that is substantially insoluble in photoresist solvents.

3. The method of claim 2, wherein said crosslinking occurs through said crosslinkable groups on said crosslinkable chromophore.

4. The method of claim 2, said method further comprising
   (d) exposing said imaging layer and said anti-reflective layer to light to yield exposed portions of said imaging layer and said and-reflective layer; and
   (e) contacting said imaging layer and said anti-reflective layer with an alkaline developer so as to remove said exposed portions from said substrate surface.

5. The method of claim 4, wherein said exposing (d) results in decrosslinking said anti-reflective layer.

6. The method of claim 4, said anti-reflective layer having an initial solubility in an alkaline developer, wherein after said exposing (d), said exposed portions of said anti-reflective layer have a final solubility in alkaline developer, said final solubility being greater than said initial solubility.

7. The method of claim 4, wherein after said contacting (e) less than about 5 nm of anti-reflective coating thickness remains in said exposed portions.

8. The method of claim 4, wherein said imaging layer and said anti-reflective layer after said contacting (e) have respective openings formed therein, wherein said openings are substantially aligned such that said substrate surface is uncovered.

9. The method of claim 8, further comprising:
   directing ions at said structure so as to cause at least some of the ions to become implanted within the substrate so as to form an ion implant area in the substrate, wherein said ion implant area is formed below said openings.

10. The method of claim 4, wherein said imaging layer generates an acid during said exposing (d) which decrosslinks said exposed portions of said anti-reflective layer.

11. The method of claim 4, wherein said exposing (d) results in breaking the bond formed between said crosslinker and said crosslinkable chromophore on said compound.

12. The method of claim 4, wherein said exposing (d) comprises exposing said imaging layer and said anti-reflective to light having a wavelength of from about 193 nm about 365 nm.

13. The method of claim 1, wherein said polymeric multi-functional epoxy compound comprises multiple epoxy moieties pendant from said polymeric core unit.

14. The method of claim 13, wherein said polymeric core unit comprises recurring monomers of:

where each $R_2$ is individually an unreacted epoxy moiety, or a ring-opened epoxy moiety of the formula:

wherein * is the attachment point to the compound, each y is 0 or 1, each X is said crosslinkable chromophore, each L is individually an amino, ether, thio, thioether, hydrazine, sulfinate, sulfonate, sulfonamide, ester, carbonate, carbamate, amide, or urea linkage, each R, when present, is individually an oxygen atom or —$CH_2$—, and each $R_1$ is individually an —H, alkyl, sulfonate, ester, carbonate, or carbamate.

15. The method of claim 1, wherein said vinyl ether crosslinker is a multi-functional vinyl ether of the formula:

where R' is selected from the group consisting of aryls and alkyls, each $R_4$ is individually selected from the group consisting of alkyls, alkoxys, carbonyls, and combinations of two or more of the foregoing, and n is at least 2.

16. A method of forming a microelectronic structure, said method comprising:
(a) providing a substrate having a surface;
(b) forming a photosensitive, developer-soluble anti-reflective layer on said surface, said anti-reflective layer being formed from an anti-reflective composition comprising a polymeric multi-functional epoxy compound and a separate vinyl ether crosslinker dispersed or dissolved in a solvent system, wherein said polymeric multi-functional epoxy compound comprises multiple epoxy moieties pendant from a polymeric core unit and at least one crosslinkable chromophore bonded to said polymeric multi-functional epoxy compound, said polymeric core unit comprising recurring monomers of:

where each $R_2$ is individually an unreacted epoxy moiety, or a ring-opened epoxy moiety of the formula:

wherein * is the attachment point to the compound, each y is 0 or 1, each X is said crosslinkable chromophore, each L is individually an amino, ether, thio, thioether, hydrazine, sulfinate, sulfonate, sulfonamide, ester, carbonate, carbamate, amide, or urea linkage, each R, when present, is individually an oxygen atom or —$CH_2$—, and each $R_1$ is individually an —H, alkyl, sulfonate, ester, carbonate, or carbamate, wherein said anti-reflective composition comprises 0% by weight of acid generators, based upon the total weight of the composition taken as 100% by weight, wherein said polymeric core unit is derived from a co-polymer selected from the group consisting of poly(styrene-co-glycidyl methacrylate), poly(p-tert-butoxycarbonyloxystryene-co-glycidyl metbacrylate), and poly(tert-butyl methacrylate-co-glycidyl methacrylate); and
(c) forming an imaging layer on said anti-reflective layer.

17. The method of claim 1, said vinyl ether crosslinker being present in said composition at a level of from about 0.1% to about 1% by weight, based upon the total weight of the composition taken as 100% by weight.

18. The method of claim 16, said vinyl ether crosslinker being present in said composition at a level of from about 0.1% to about 1% by weight, based upon the total weight of the composition taken as 100% by weight.

19. The method of claim 16, wherein said vinyl ether crosslinker is a multi-functional vinyl ether of the formula:

where R' is selected from the group consisting of aryls and alkyls, each $R_4$ is individually selected from the group consisting of alkyls, alkoxys, carbonyls, and combinations of two or more of the foregoing, and n is at least 2.

* * * * *